United States Patent [19]
Miyagawa et al.

[11] Patent Number: 5,504,526
[45] Date of Patent: Apr. 2, 1996

[54] SOLID-STATE IMAGE SENSING DEVICE WITH STORAGE-DIODE POTENTIAL CONTROLLER

[75] Inventors: Ryohei Miyagawa, Yokohama; Shinji Ohsawa, Tokyo; Hirofumi Yamashita, Kawasaki; Michio Sasaki, Yokohama; Yoshiyuki Matsunaga, Kamakura, all of Japan

[73] Assignee: Kabushiki Kaisha Toshiba, Kawasaki, Japan

[21] Appl. No.: 155,833

[22] Filed: Nov. 23, 1993

[30] Foreign Application Priority Data

Nov. 24, 1992 [JP] Japan .................................. 4-313667

[51] Int. Cl.[6] .................................................. H04N 5/335
[52] U.S. Cl. ...................... 348/313; 348/311; 348/314
[58] Field of Search .................................. 348/306, 313, 348/314, 294, 302, 311; 257/230

[56] References Cited

U.S. PATENT DOCUMENTS

| | | | |
|---|---|---|---|
| 4,758,894 | 7/1988 | Harada et al. | 358/213.31 |
| 4,912,560 | 3/1990 | Osawa et al. | 358/213.31 |
| 4,963,983 | 10/1990 | Kohno et al. | 358/213.31 |
| 4,989,095 | 1/1991 | Whitesel et al. | 358/213.19 |
| 5,063,449 | 11/1991 | Shibata et al. | 358/213.11 |
| 5,068,701 | 11/1991 | Prieur-Dreron | 357/24 |
| 5,081,536 | 1/1992 | Tardon et al. | 358/213.31 |
| 5,136,389 | 8/1992 | Suzuki et al. | 358/213.31 |

*Primary Examiner*—Joseph Mancuso
*Assistant Examiner*—Bipin Shalwala
*Attorney, Agent, or Firm*—Finnegan, Henderson, Farabow, Garrett & Dunner

[57] ABSTRACT

A solid-state imaging device includes a substrate, and an array of charge-packet storage cells or picture elements (or "pixels") arranged on the substrate, each including a storage diode that stores therein a signal charge packet indicative of an incident light. A charge transfer section is coupled with the array of picture elements. The transfer section includes a charge-coupled device (CCD) register layer that is spaced apart from the storage diode to define a channel region therebetween, and a first insulated electrode overlying the register layer and the channel region. A reset section is coupled to the storage diode, for potentially resetting the storage diode by additionally injecting an extra charge packet into the storage diode and by causing the charge to drained from the storage diode. A potential controller is provided which forces, when a signal charge packet is read out of the storage diode toward the CCD register layer, the storage diode to decrease in potential so that the storage diode becomes potentially less than its potential as set during the reset operation, while causing the channel region to be fixed at almost the same potential during the read operation and the reset operation.

11 Claims, 6 Drawing Sheets

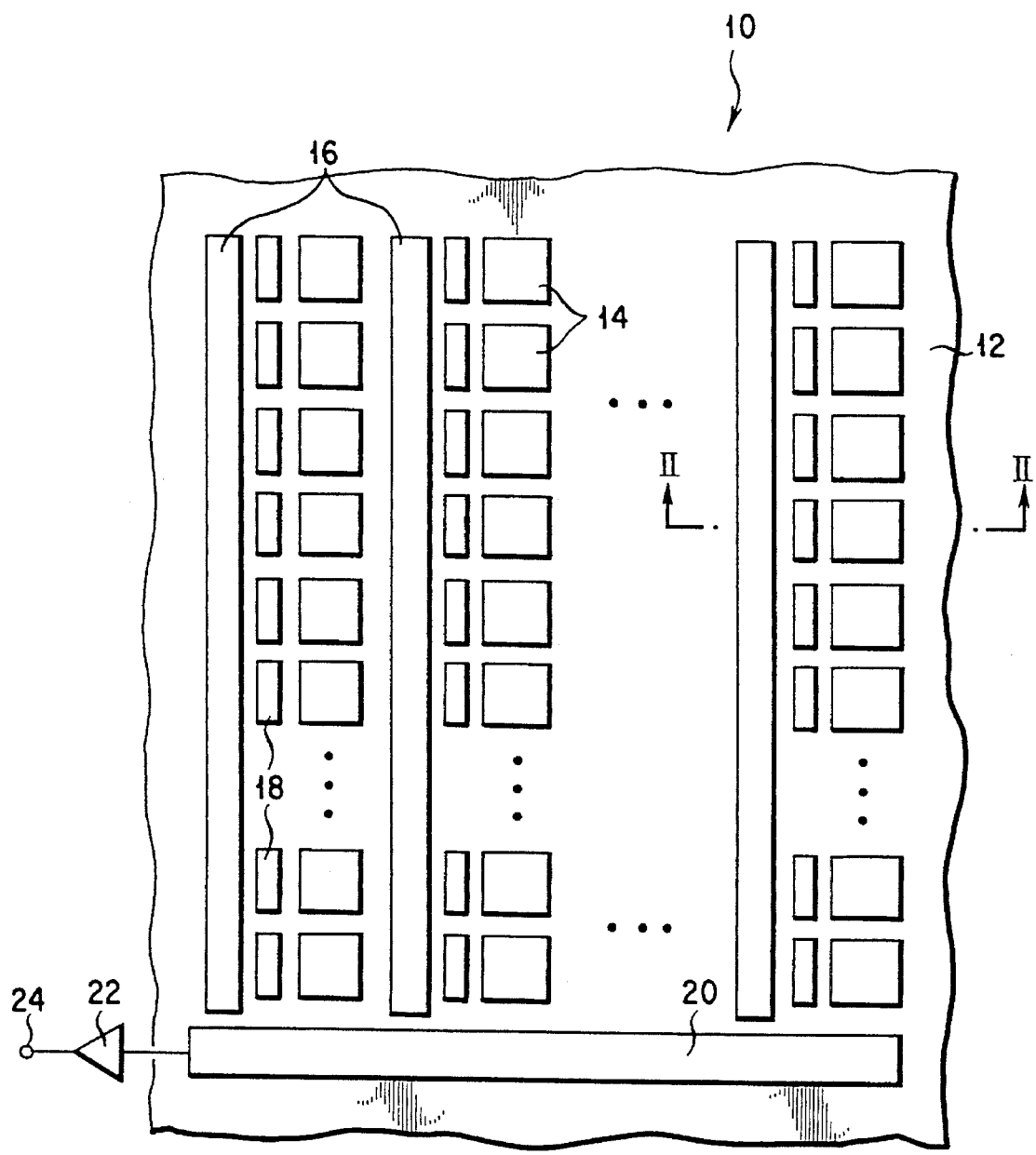
F I G. 1

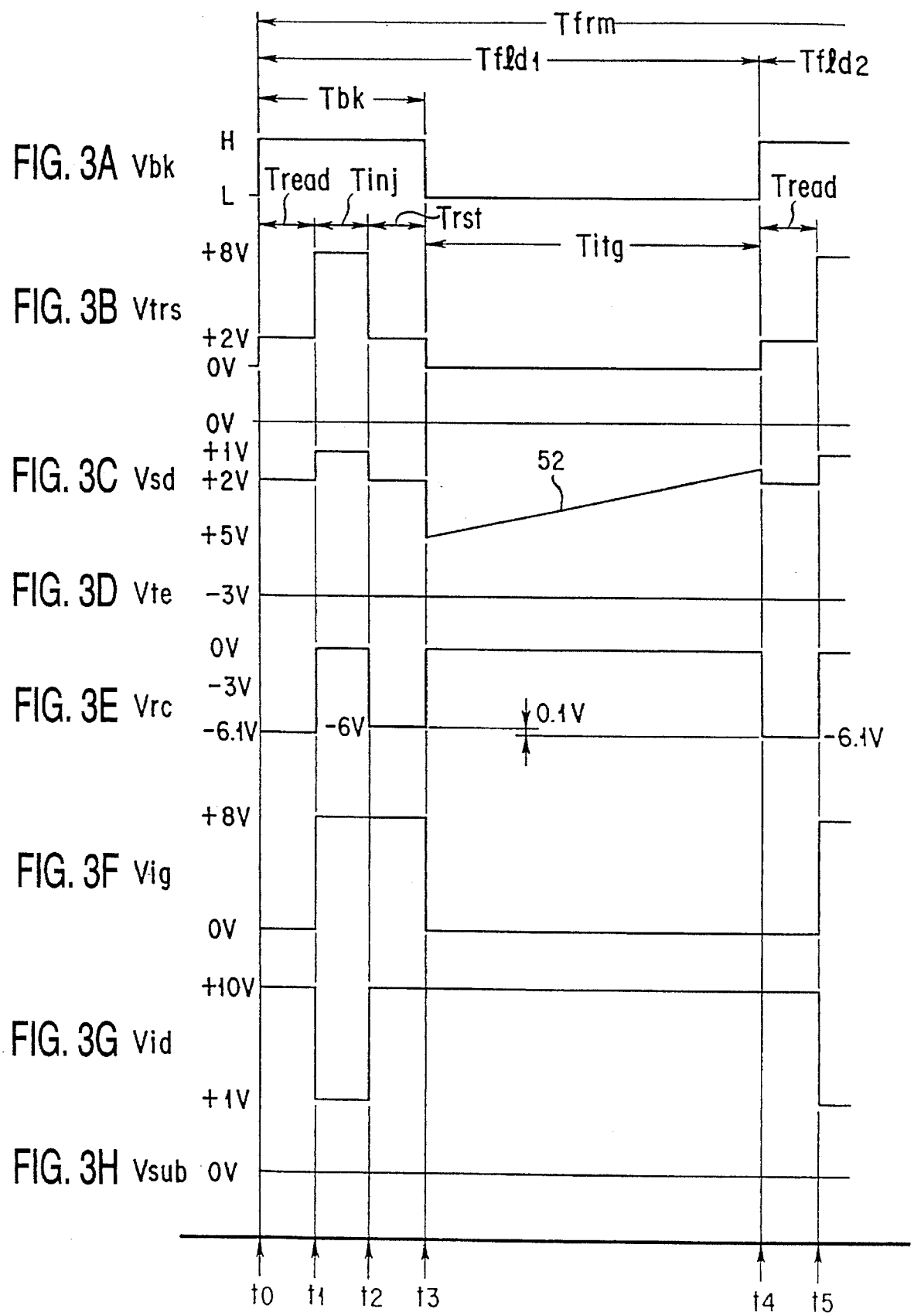

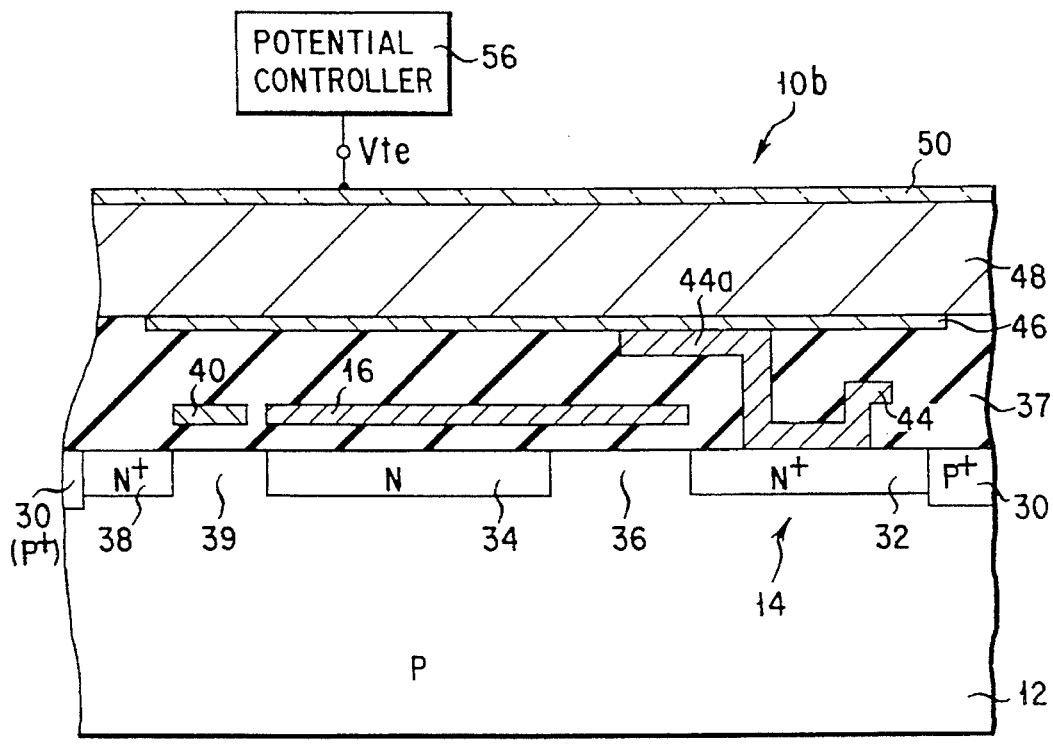
F I G. 5
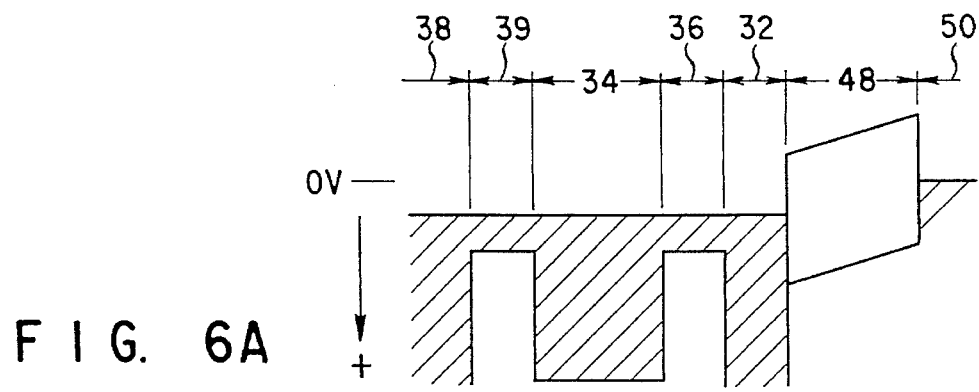
F I G. 6A
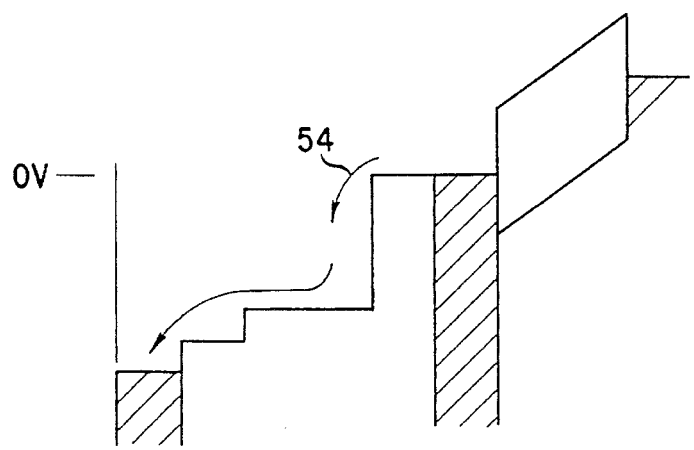
F I G. 6B

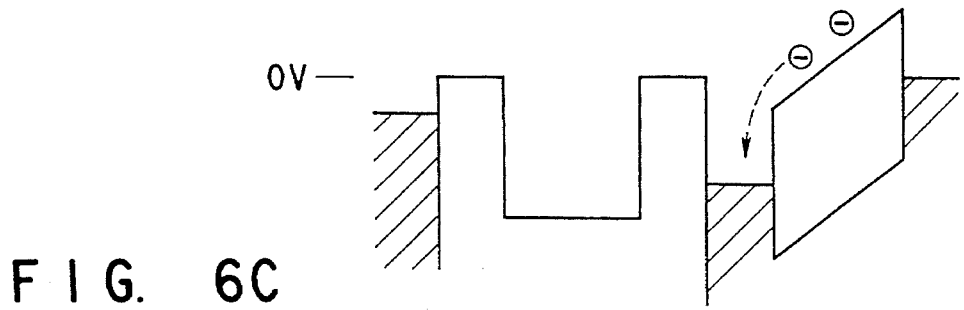
F I G. 6C
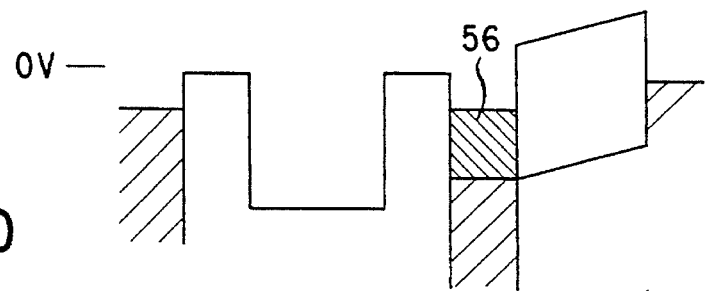
F I G. 6D
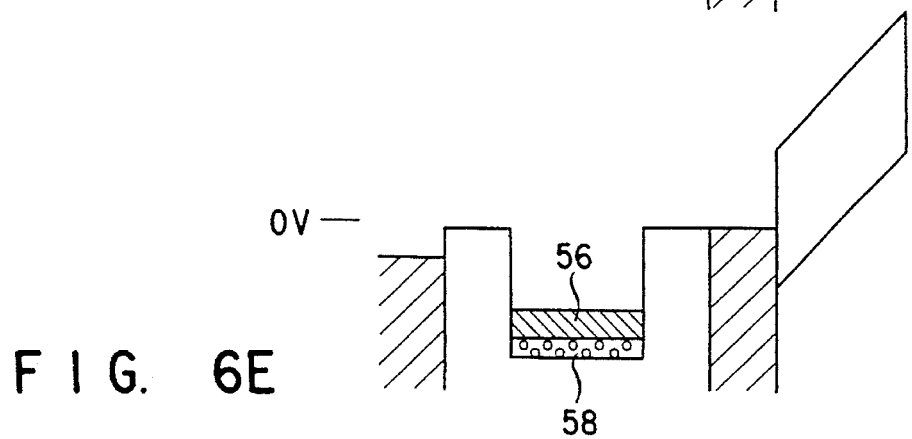
F I G. 6E
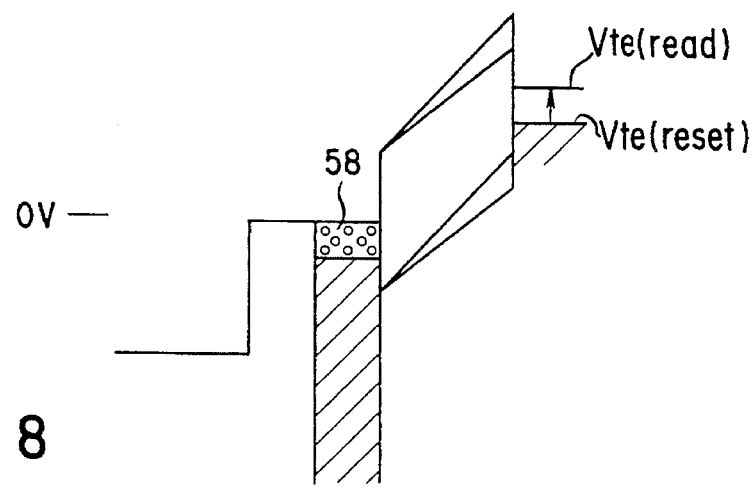
F I G. 8

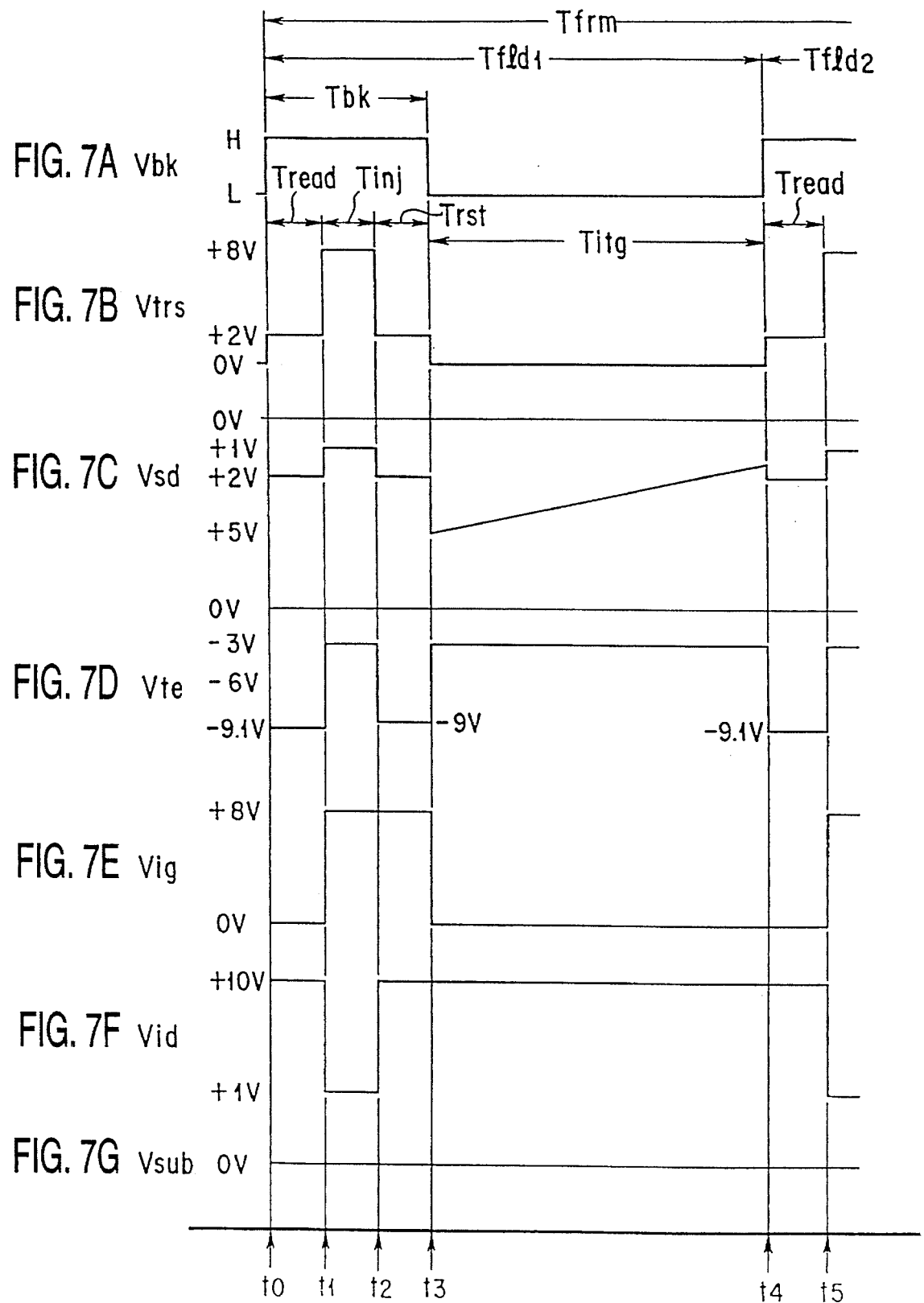

SOLID-STATE IMAGE SENSING DEVICE WITH STORAGE-DIODE POTENTIAL CONTROLLER

BACKGROUND OF THE INVENTION

1. Field of the Invention

The present invention relates generally to solid-state imaging devices, and more particularly to a highly integrated solid-state imager including an array of picture elements or cells each having a diode for storing therein a packet of photoelectrically produced signal-charge carriers indicative of an incident image introduced from a scene.

2. Description of the Related Art

Solid-state image sensing devices are becoming more widely used in the manufacture of photoelectric equipments, including video movie cameras, electronic still cameras, input image acquisition devices for computer systems, etc., as the reliability and cost advantages of these imaging devices increase. The cost per cell of storage using solid-state imagers has gone down as the number of cells or picture element per package goes up.

A charge-coupled device (CCD) is well known as one of the solid-state image sensing devices. A presently available CCD imager is arranged to include a substrate, an array of rows and columns of picture elements or cells (called the "pixels" in the art of image sensors) on the substrate, and a charge transfer section coupled to the array of cells on the substrate. Typically, each cell includes a diode that stores or integrates therein a packet of charge carriers indicative of an input optical image. The charge transfer section includes a plurality of first parallel charge transfer sections coupled to the rows of cells. Each of these transfer sections allows the charge carriers, which are called the "signal charge" in the CCD imager art, to move together from the cells in a corresponding one of the rows and transfer sequentially toward an output of each transfer section. The first charge transfer sections are called the "vertical charge-transfer registers." The charge transfer section also includes a second charge transfer section, which may be called the "horizontal charge-transfer register." This horizontal transfer register is coupled to the outputs of the vertical transfer registers, for causing the signal charge fed thereinto by the vertical transfer registers to sequentially transfer toward its output, which may be connected to an amplifier circuitry.

As the number of cells increases, the size of them decreases, the effective photosensitive area decreases in each cell, and the magnitude of the charge-storage diode in each cell of necessity decreases. These factors reduce the sensitivity of the CCD imager as a whole. Another saying of this is that there is a trade-off between the achievement of a higher integration density and the achievement of a higher reliability: Making the cell size smaller can improve the CCD integration density, but making it too small can also degrade the reliability; the performance of photoelectric conversion (the efficiency of the generation amount of effective signal charge carriers per incident light) decreases, causing the signal-to-noise ratio to decrease.

Conventionally, a highly integrated CCD imaging device is known which attains an increased area of cells on a substrate of a limited size, by specifically arranging so that a photoconductive layer is stacked on CCD elements of vertical and horizontal charge transfer registers, thus causing the photosensitive area to increase. With such a stacked type CCD imager, since the charge-storage diode is prevented from being completely depleted in each cell, what is called a "capacitive afterimage" phenomenon will possibly take place depending upon the presence of a static capacitance of the storage diode. To eliminate the occurrence of such an afterimage, the storage diode is potentially reset, by injecting a charge into the storage diode and then causing the charge to be drained before the signal-charge storage period. However, with such a potential reset scheme for the storage diode, what is called the "fixed-pattern noise generation" problem is raised as will be described below.

The prior-art CCD imager is arranged in the individual cell as follows. A semiconductor substrate of P type conductivity has a top surface including a specific surface area surrounded by a heavily-doped P type (P+ type) semiconductive channel stopper layer, which is same in conductivity type as the substrate. Three spaced-apart N type semiconductor layers are arranged in the specific area: a heavily-doped N type (N+ type) storage-diode layer, an N type CCD register layer, and an N+ type carrier-injection diode layer that is coupled to the channel stopper layer. A transfer channel region is defined between the storage diode layer and the CCD register layer. A conductive layer acting as a transfer electrode overlies the CCD register and the transfer channel region. A gate electrode (carrier injection electrode) overlies a substrate surface area as defined between the CCD register layer and the injection diode layer. A photoconductive layer is arranged to overlie all the above components over the substrate so that this layer is connected to the storage-diode layer. The photoconductive layer is covered with a transparent electrode on its flat top surface.

When an incident light enters the photoconductive layer, this layer produces electrons and holes by the photoelectric conversion effect. The electrons are collected in the storage diode as the effective signal charge carriers. During such a charge integration or storage period, the transfer electrode is at the ground potential, causing the stored charge carriers to be prevented from being read out of the diode to the CCD register layer. At the end of the charge storage period, the transfer electrode goes high in potential, causing the signal charge to move from the diode toward the CCD register layer through the transfer channel region. This means that all the signal charge is read out of the storage diode into a corresponding one of parallel vertical transfer registers at a time. The storage diode potentially approaches the transfer channel region. If the potential difference therebetween becomes a specific value, the transfer channel region begins to exhibit relatively large resistance value. Due to the presence of such large channel resistance, a part of the signal charge is unable to flow into the CCD register layer and remain in the storage diode continuously. If such carriers are read out lately during a following field period, a resultant image may contain an afterimage component undesirably.

To eliminate the occurrence of an afterimage, the prior-art CCD imager is arranged to potentially reset the storage diode by (1) injecting an extra packet of charge carriers into the storage diode in each cell, and (2) then forcing the charge packet to drain away from the diode to the injection diode. With such a reset operation, the storage diode is rendered constant in potential at the beginning of every field period, whereby any charge indicative of a pixel image of a prior field period is no longer remained, so that no afterimage takes place.

With such a storage-diode reset scheme, while the transparent electrode is fixed at a predetermined potential of the positive polarity throughout the entire operation period, the transfer electrode varies in potential to be at different potential levels during the signal-charge read period and the reset period. More specifically, during the reset period, the transfer electrode is set at a positive-polarity potential for the injection and exhaust of extra charge carriers. During the signal-charge read period, the transfer electrode (1) potentially drops down causing the channel region to turn off to thereby allow a charge to be stored or integrated in the storage diode, and then (2) rises in potential again causing the signal charge to be read out of the storage diode toward the CCD register. The potential of the transfer electrode at this time is higher than its potential as held during the reset operation, whereby a certain amount of charge corresponding to the potential difference may be also read out as a "bias charge" in addition to the signal charge.

It will not always occur that, when the transfer electrode varies in potential as described above, each of the transfer channel regions for an increased number of cells potentially varies so as to follow it precisely. Another saying of this is that, even if the potential of the transfer electrode was set at a preselected potential level with respect to the individual cell, it cannot be expected that the potential of transfer channel region remains uniform among the cells. Practically, it is more likely that the channel-region potential may vary in potential among the cells during the operation of the CCD imager. The reason for this is that the cells may vary inevitably in the thickness of a dielectric film arranged between the substrate and the transfer electrode, the impurity doping density of channel region, the length of channel region, and the like due to the occurrence of inherent variations in the semiconductor process parameters during the manufacture of CCD imager devices. Naturally, such variations of the transfer channel potential among the cells result in that the bias charge becomes variable in amount with respect to respective cells. The bias charge variation causes a fixed-pattern noise generation" problem to take place undesirably. The signal-to-noise ratio is thus reduced causing a reproduced image to decrease in quality.

A stacked type solid-state imaging device is disclosed, for example, in U.S. Pat. No. 4,912,560 granted Mar. 27, 1990 under the title of "Solid State Image Sensing Device" (Assignee is Kabushiki Kaisha Toshiba), wherein the imager has a photoconductive film stacked to overlie an array of cells. Each of these cells includes an N type storage diode layer, which is arranged in a P type well region formed in the surface of an N type semiconductor substrate. A vertical CCD register is also arranged in the well region to define a channel between the storage-diode layer and itself. A transfer electrode overlies the channel to act as an insulated gate of a resultant metal oxide semiconductor (MOS) transistor structure. The storage diode is reset by injecting charge and then draining it away in such a manner that excessive bias charges are discharged by way of the vertical CCD register by forcing the gate to go high.

SUMMARY OF THE INVENTION

It is therefore an object of the present invention to provide a new and improved solid-state imaging device.

It is another object of the invention to provide a new and improved solid-state imaging device which can exhibit an enhanced integration density and a maximized signal-to-noise ratio to permit the reproduction of an image at higher quality.

In accordance with the above objects, the present invention is drawn to a specific solid-state imaging device, which includes a substrate, and an array of picture elements or cells on the substrate. Each of the cells includes a charge storage layer for storing therein a charge indicative of an incident light. A charge transfer section is arranged so that it is coupled to the array of cells. The transfer section has a spaced-apart charge-coupled device (CCD) register layer defining a channel region between the register layer and the storage layer in the substrate, and an insulated transfer electrode overlying the register layer and the channel region. A transparent electrode is arranged so that it covers the array of cells. A reset device is arranged which potentially resets the storage layer by additionally injecting a charge into the storage layer and then causing the charge to be drained from the storage layer. A packet of signal charge is read out of the storage layer toward the CCD register layer through the channel region, by causing the storage layer to vary in potential while having the channel region fixed at a certain potential, rather than by controlling the potential of the channel region under the control of the transfer electrode. The certain potential is a preselected potential that is high enough to render the channel region conductive; alternatively, the certain potential may be forced to be substantially the same as that of the substrate.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 1 is a diagram illustrating in schematic form the top view of a solid-state imaging device in accordance with one preferred embodiment of the invention.

FIGS. 3A to 3H are illustrations of timing diagrams showing the pulse sequence for the operation of the embodiment of FIGS. 1 and 2 during a field period.

FIG. 5 is a diagram showing the cross-sectional view of a main part of a CCD imager in accordance with a still another embodiment of the invention.

FIGS. 6A to 6E are diagrams showing potential wells at some of the major steps in the operation of the embodiment of FIG. 5.

FIGS. 7A to 7G are illustrations of timing diagrams showing the pulse sequence for the operation of the embodiment of FIG. 5.

FIG. 8 illustrates a potential well for showing a potential difference of a transparent electrode between a reset operation and a read operation.

DETAILED DESCRIPTION OF THE PREFERRED EMBODIMENTS

Figure 2:
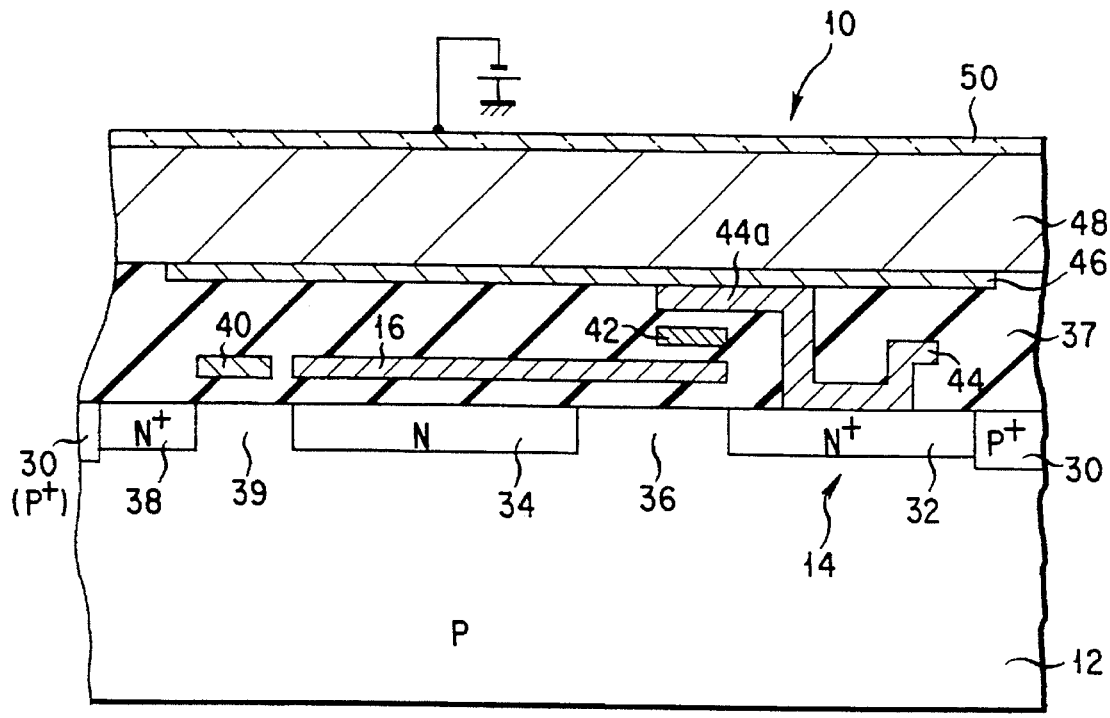
FIG. 2 is a diagram showing the cross-sectional view of a main part of the imager of FIG. 1 along a line II—II.

Referring now to FIG. 1, a charge-coupled device (CCD) image sensing device in accordance with one preferred embodiment of the invention is generally designated by the numeral 10. The CCD imager 10 has a semiconductor substrate 12 of a preselected type of conductivity. This substrate may be made from silicon of P type conductivity. An array of rows and columns of picture elements 14 are arranged in the surface of substrate 12. These picture elements 14 are charge-packet storage cells, which will be called the "pixels," or more simply "cells" in the description. Cells 14 have a matrix configuration on substrate surface. Each of these pixels 14 includes a PN-junction diode element, the detailed internal structure of which will be explained later in the description.

Each column of cells is associated with a corresponding one of vertical charge-transfer sections 16. A signal-carrier read section 18 is arranged between each cell column and a corresponding vertical transfer section 16 associated therewith. Vertical transfer sections 16 may also be referred to as "vertical CCD registers"; they may alternatively be called "vertical CCD channels" in some situations.

As shown in FIG. 1, the vertical transfer sections 16 have signal-carrier outputs, at which these sections are coupled to a horizontal charge-transfer section 20. Horizontal transfer section 20 may also be called the "horizontal CCD register." Horizontal transfer register 20 receives a packet of signal charge that is transferred from vertical transfer registers 16, and causes it to move sequentially toward the output thereof. A known amplifier circuit 22 is connected to the output of horizontal transfer register 20. This amplifier generates an amplified image signal at an output terminal 24 of the CCD image sensor 10.

FIG. 2 indicates a cross-sectional structure of the imager 10, which corresponds to a certain one of the array of rows and columns of cells 14 and a vertical transfer register 16 associated therewith. The same goes with any one of the remaining cells 14.

As shown in FIG. 2, a cell 14 is arranged in a specific surface area of the substrate 12, which area is defined by a heavily-doped P type (P+ type) semiconductor layer 30, which serves as a channel stopper. Picture element 14 includes a heavily-doped N type (N+ type) semiconductor layer 32, which is arranged in substrate 12 to constitute a PN-junction diode structure together with substrate 12. Layer 32 is called a "charge-storage diode" hereinafter.

An N type semiconductor layer 34 is arranged in the substrate surface area so that it is spaced apart from the charge-storage diode 32 to define a channel region 36 therebetween in substrate 12. Layer 34 acts as a vertical CCD register. A conductive layer 16 is arranged in a dielectric layer 37; the layer 16 is formed in a first level to overlie CCD register 34 and channel region 36. Layer 16 functions as a vertical charge-transfer electrode. A metal oxide semiconductor field effect transistor (MOSFET) structure is thus formed with charge-storage diode layer 32 and CCD register layer 34 being as its source and drain, and with vertical transfer electrode 16 being as its insulated gate.

An N+ type semiconductor layer 38 is arranged so that it is spaced apart from the opposite side of the CCD register layer 34 in the substrate surface area as shown in FIG. 2. N+ type layer 38 constitutes another PN-junction diode, which is called the "charge injection" diode. CCD register layer 34 and N+ type layer 38 defines a charge-injection channel region 39 therebetween. Another insulated gate electrode 40 is formed in the dielectric layer 37 so as to overlie the charge-injection channel region 39. Gate electrode 40 is positioned in the first level, whereat the vertical transfer electrode is positioned as described previously. The electrodes 16, 40 are electrically separated from each other.

A conductive layer 42 is formed in a second level above the vertical transfer electrode 16 in the dielectric layer 37. The layer 42 overlies the right-side edge portion of transfer electrode 16 as shown in FIG. 2. More specifically, layer 42 has a first edge portion that is substantially self-aligned with both the right-side edge of transfer electrode 16 and a specific end (left-side end in the illustration of FIG. 2) of the N+ type charge-storage diode layer 32 whereat this layer is contacted with the channel region 36. Layer 42 has a second edge portion that terminates at almost the middle of channel region 36. Layer 42 acts as a "charge read control" gate electrode, the function of which will be described later. This read control gate 42 may be an elongate layer that extends over the substrate surface in a direction parallel with the horizontal CCD register 20 of FIG. 1, so that a row of cells (which belong to different columns respectively) are associated in common with one read control gate 42. Read control gate 42 may alternatively be a single layer that is associated with all the rows and columns of the cells 14.

Another conductive layer 44 is arranged in the dielectric layer 37 so that this layer has an "L"-shaped profile, wherein the bottom bar of the "L" is mounted on the substrate surface and is directly contacted with the N+ type charge-storage diode layer 32. Layer 44 also has a horizontal "canopy"-like layer section 44a that is formed in a third level in dielectric layer 37 to overlie the charge read control electrode 42 as shown in FIG. 2. Layer section 44a is coupled to the vertical pole of "L" to exhibit a step-of-staircase like cross-section as a whole. Layer section 44a has an edge that is substantially self-aligned with the second edge portion of charge read control electrode 42. The top surface of layer 44a is in contact with the bottom surface of a thin picture-element electrode 46, which is arranged in the flat surface of dielectric layer 37 in such a manner that the top surface of picture-element electrode 46 is flush with the surface of dielectric layer 37 as is apparent from FIG. 2.

A photoconductive layer 48 is arranged on the entire surface of the dielectric layer 37 so that photoconductive layer 48 is electrically connected to the picture-element electrode 46, which is connected by the step-of-staircase like layer 44 to the N+ type charge-storage diode layer 32. Layer 44 will be called a "lead electrode" hereinafter. Photoconductive layer 48 has a flat surface, which is covered by a thin transparent conductive layer 50. Layer 48 may be made from amorphous silicon. Layer 50 may be made from known indium-tin-oxide (ITO). This Layer 50 serves as a transparent electrode.

Very importantly, the charge read control electrode 42 is capacitively coupled with the charge-storage diode 32 to provide an additional charge read-out gate structure. By causing the read gate 42 to vary potentially, it becomes possible to force storage diode 32 to vary in potential accordingly.

The operation of the CCD imager 10 is as follows. When an incident light is introduced to imager 10, the light passes through transparent electrode 50 to enter the photoconductive layer 48, which produces therein a number of electron-hole pairs by the photoelectric conversion effect. The electrons are supplied by the lead electrode 44 to the N+ type charge-storage diode 32 and are collected or integrated therein. During the charge integration period, the substrate 12 continues to be at a zero-volt voltage, while the transfer electrode 16 is at zero volts (or a certain potential of the negative polarity), thus causing the channel region 36 to turn off, whereby no charges are read out of diode 32 toward CCD register layer 34.

The above charge integration period is designated by "Titg" in each of the first and second field periods Tfld1, Tfld2 constituting a frame period Tfrm as shown in timing diagrams of FIGS. 3A to 3H. Prior to the charge integration period Titg, the storage diode layer 32 is potentially reset at the beginning of each field period Tfld. To do this, after a blanking signal Vbk (FIG. 3A) goes high at a time point t0 in the first field period Tfld1 and the signal charge packet which has been integrated during a preceding field period (not shown in FIGS. 3A to 3H) is read out of the CCD register layer 34 beneath the vertical transfer electrode 16, the voltage Vtrs (FIG. 3B) of the transfer electrode 16 and the voltage Vig (FIG. 3F) of the injection gate electrode 40 rise in potential at +8V at a time point t1, while the voltage Vid (FIG. 3G) of the injection diode 38 drops down from +10V to +1V, thus causing extra charge carriers to inject from the injection diode 38 into the storage diode 32 through the CCD register 34. This means that the storage diode 32 is electrically connected to the injection diode 38. The storage-diode voltage Vsd (FIG. 3C) becomes substantially equivalent to the injection-diode voltage Vid.

Thereafter, at a time point t2, while the transfer electrode 16 and the injection gate electrode 40 are maintained high in potential (typically, the transfer-electrode voltage Vtrs is at +2V, and the injection-gate voltage rig is at +8V), the voltage Vid (FIG. 3G) of the injection diode 38 goes high at +10V. As a result, almost all the charge carriers accumulated in the storage diode 32 are forced to flow reversely and drain therefrom. At this time, the voltage Vsd (FIG. 3C) of the storage diode 32 is reset so that it becomes substantially equivalent in potential to the transfer-electrode voltage Vtrs (FIG. 3B). (Note here that in the timing diagram of FIG. 3, the potential variation of the storage diode 32 is indicated in such a manner that the positive polarity is plotted downward as it is common practice in the art of CCD devices.) With such a reset operation, the voltage Vsd of storage diode 32 can be constant at the beginning of each field period Tfld1, Tfld2, whereby it becomes possible to prevent any undesirable charge (the "remainder" charge of a preceding field period) from being mixed in the signal charge so that afterimage does no longer take place. At a time t3, the transfer electrode 16 and the injection gate 40 drop down at 0V. The period as defined between the time points t2 and t3 is a reset period Trst as shown in FIG. 3.

The accumulation or integration of signal charge packet is performed during a period Titg defined from the time t3 to a time point t4. During the integration period Titg, the transfer electrode 16 and the injection gate 40 are held at 0V. A packet of charge, which is produced by photoelectric conversion in the photoconductive layer 48 as described previously, is supplied to the storage diode 32 through the lead electrode 44, and accumulated or integrated therein as a signal charge. The voltage Vsd of the storage diode 32 is thus decreased gradually as indicated by the numeral 52 in FIG. 3C.

At the time t4 at the end of the charge integration period Titg (which time corresponds to the end of the first field period Tfld1 and also to the beginning of the second field period Tfld2), the transfer electrode 16 is set at +2V, which is same as the positive potential during the reset period Trst; this renders the transfer channel region 36 conductive, causing the MOSFET as mentioned previously to turn on. In the channel region 36 beneath the transfer electrode 16, a surface potential well (or "bucket") becomes deeper. The charge integrated in the storage diode 32 is then transferred to the vertical CCD register 34 as a signal charge packet. Such charge read operation terminates at a time point t5, which is included in the subsequent, second field period Tfld2. The voltage Vte of the transparent electrode 50 remains constant throughout the period as defined between the time points t0 and t5; the transparent-electrode voltage Vte may be fixed at −3V, for example, as shown in FIG. 3D.

Basically, the signal-charge read operation may be carried out in an "all-at-a-time read" drive scheme, wherein all the cells of FIG. 1 are subjected to a charge read operation at a time. More advantageously, a "line-dependent time-shift read" scheme may alternatively be employed in such a manner that the signal-charge read operation is performed with respect to a row of cells in the horizontal direction, while having the read timing changed among them. In the case where a plurality of parallel read control gate electrodes 42 (each of which is associated with a corresponding one of the rows of cells 14) are arranged so as to elongate in parallel with the horizontal CCD register 20 of FIG. 1 as described previously, the latter read-driving technique may be specifically preferable to the embodiment. Note that, as far as the individual cell is concerned, the charge-read concept of the invention is universal irrespective of which one of the above techniques is actually selected.

The signal-charge read operation from respective cells toward the vertical CCD register sections 16 of FIG. 1 is carried out during a period Tread defined between the time points t4 and t5 in the timing diagram of FIGS. 3A to 3H. The signal charge thus read is sequentially transferred in the parallel CCD registers 16 toward the horizontal CCD register 20 in a known manner; the charge is then amplified by the output amplifier 22, which generates a corresponding output image signal at the output terminal 24.

When the potential difference between the storage diode 32 and the channel region 36 is a specific value that may be several times of kT (where "k" is the Boltzmann constant, and "T" is the absolute temperature), the transfer MOSFET including the channel region 36 becomes in a weak-inversion state. The channel region 36 exhibits a relatively large value of resistance, equivalently. With such an increase in the channel resistance, a part of the signal charge packet remains within the storage diode 32 even after the read operation. If such a "remainder" charge is read out during a next field period, afterimage will occur. The remainder charge in each cell during the first field period Tfld1 is forced to disappear or drain away by a reset operation being performed for the storage diode 32 at the beginning of a subsequent, second field period Tfld2. This reset operation is similar in principle to that as described previously.

In connection with the reset operation, the presence of the charge-read control electrode 42 (which is capacitively coupled to the storage diode 32 as mentioned earlier) is specifically important to the present invention, as will be described below. The read control electrode 42 is forced to be fixed at a specifically preselected potential level when resetting of the storage diode 32 during each field period Tfld. For example, as shown in FIG. 3E, the read-control electrode voltage Vrc is maintained at a certain potential (−6V, for example) during the reset period Trst as defined between the time points t2 and t3. After the transfer MOSFET arranged with the transfer electrode 16 as its gate turns off at time t3 causing the charge integration to begin so that a signal charge packet is newly integrated in the storage diode 32, the voltage Vrc of read-control electrode 42 drops negatively at time t4. The read-control electrode 42 is at −6.1V, for example. This potential level should be suitably selected so as to permit the successful read of a desired amount of bias charge (0.1V in this embodiment) when no incident light is introduced and thus the signal charge is zero. As the control electrode voltage Vrc drops negatively, the storage diode 32 being capacitively coupled thereto also drops in potential accordingly. Under such a condition, the transfer electrode 16 rises positively at +2V as mentioned previously, thus causing the transfer MOSFET to turn on. With such a "forced potential-pulling" action, the channel region 36 of this MOSFET shown in FIG. 2 is forced to hold or maintain substantially the same potential level during the reset period Trst and the read period Tread. In other words, the channel region 36 is fixed at a specific potential level during the reset and signal-charge read operations. Such forced potential-pulling at a fixed level does not depend upon variations in the physical and/or electric characteristics among the cells, which variations may inherently take place as influenced by the manufacturing process. Potential variations at the transfer channel region 36 are suppressed or eliminated with respect to the increased number of cells of FIG. 1; therefore, it becomes possible to successfully suppress the occurrence of variations in the bias charge among the cells.

Another saying of this is that, with the "transfer-channel potential hold" feature of the invention, the amount of bias charge with respect to every cell can be successfully controlled by the charge-read control electrode 42. Naturally, it may still happen that the bias charge amount may possibly vary if the inherent electrostatic capacitance defined between the read-control electrode 42 and the storage diode 32 changes or deviates by itself with respect to every cell; however, such problem is not serious because it is quite easy to reduce such deviation in the electrostatic capacitance to the extent that it is sufficiently small to be practically negligible when the invention is reduced to practice. Since the variations in the bias charge amount can be suppressed with respect to each cell, it becomes possible to suppress or eliminate the occurrence of a fixed-pattern noise. This may be lead to the achievement of an improved signal-to-noise ratio of the highly integrated CCD imager 10.

Figure 4:
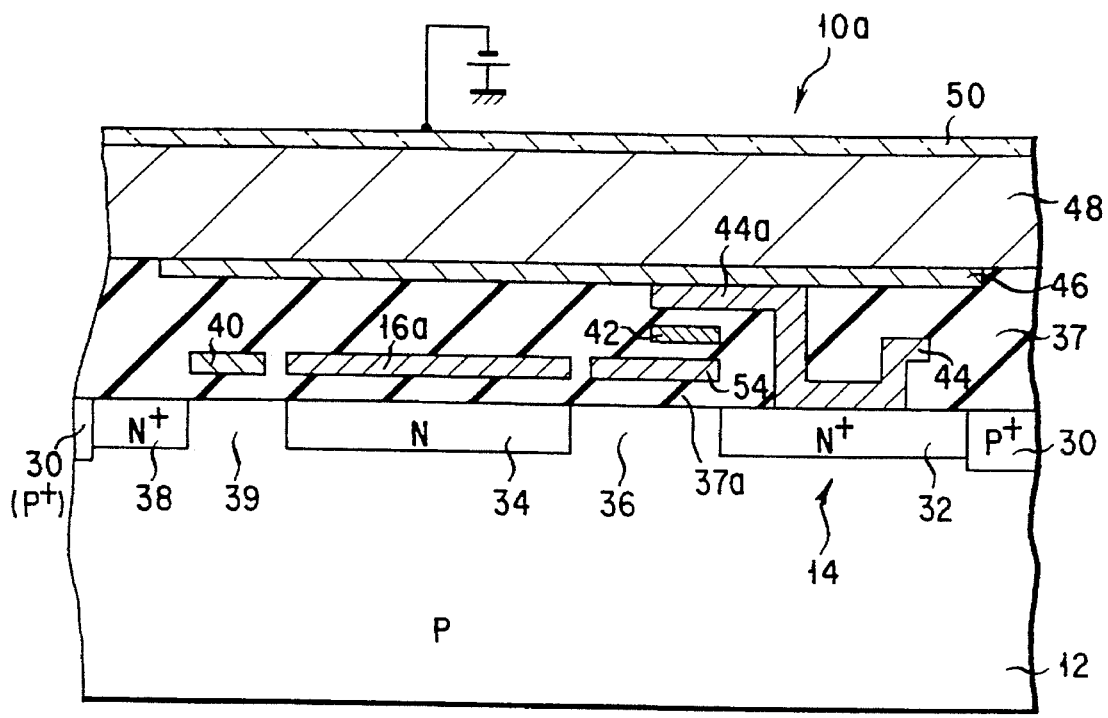
FIG. 4 is a diagram showing the cross-sectional view of a main part of a CCD imager in accordance with another embodiment of the invention.

A CCD imager 10a shown in FIG. 4 is similar to that of FIG. 2 with the electrode 16 being subdivided into two separate insulated layers 16a, 54. Layer 16a is substantially self-aligned with the underlying vertical CCD register 34. Layer 16a is same in function to the transfer electrode 16 of FIG. 2. Layer 54 overlies the transfer channel region 36, through which a packet of signal charge carriers is read out toward CCD register 34. Layer 54 is capacitively coupled with channel region 36 to act as a channel-potential control electrode that controls the potential of channel 36 independently of the potentials at CCD register 34 and storage diode 32.

The significant difference in operation between the embodiments 10, 10a is that, while these embodiments are similar in that a charge read is accomplished by specifically controlling the potential of the charge storage diode 32, rather than by controlling the potential of the transfer channel region 36, the former CCD imager 10 employs what is called a "MOS charge-read" technique, whereas the latter CCD imager 10a utilizes a "bipolar charge-read" technique. With the MOS charge-read technique of CCD imager 10, the transfer channel region 36 is rendered conductive by causing the voltage Vtrs of transfer electrode 16 to be at a positive potential (+2V as shown in FIG. 3B) during the charge read period Tread. According to the bipolar charge-read technique of CCD imager 10a, the channel region 36 is forced to remain equivalent to the substrate potential Vsub (0V, the ground potential) during the read period Tread, thus causing channel 36 to turn off.

With the CCD imager 10a of FIG. 4, when the charge injection is done for resetting the storage diode 32, the channel-potential control electrode 54 is maintained at a predetermined potential that is positive in polarity with respect to the substrate 12, causing the channel region 36 conductive. Typically, the potential may be +8 volts. The channel-potential control electrode 54 drops down at a negative potential, such as −3V, during the reset period Trst. This causes holes to be collected in the interface between the channel region 36 and a dielectric film portion laid thereon (that is, a gate insulation film of the transfer MOSFET) as indicated by the reference character 37a in FIG. 4. The transfer channel region 36 is forced to be equivalent in potential to the substrate 12, which is at 0V (ground potential); the channel turns off. Under such a condition, the read-control electrode 42 potentially drops down, causing the storage diode 32 to be lower than 0V. (The transfer electrode 16a may go high in potential; however, it is not a must.) This allows the charge to drain away from the storage diode 32 toward the injection diode 38 through the CCD register 34. The storage diode 32 is thus reset at substantially zero volts.

During the read period Tread that follows the charge integration period Titg, when the channel-potential control electrode 54 is fixed at the negative potential such as −3V, the read control electrode 42 drops down negatively in substantially the same manner as in the previous embodiment 10 so that the storage diode 32 becomes less in potential than the channel region 36. Since the channel-potential control electrode 54 continues to be at −3V, channel region 36 is controlled so that it continues to potentially maintain at the same potential as the substrate 12. The substrate potential Vsub is equivalent to a potential at the heavily-doped channel stopper 30. The holes are thus injected from the channel stopper 30 into the surface of the gate insulation film 37a on the channel region 36. The potential at this gate insulation surface becomes equivalent to that of the channel stopper 30. As a result, the channel region 36 remains constant in potential irrespective of the potential settings at its neighboring CCD register 34 and storage diode 32. While the bad influence of the short-channel effect as a result of higher integration density of cell can be decreased, variations or deviations in the transistor characteristic of the channel region 36 can be prevented in respective cells. In other words, it does not happen that the constant β (=q/kT, where q is charge amount) of the MOSFET in each cell varies by the short-channel effect so that it is far from an ideal value. The current I that flows in the channel region 36 may be represented as follows:

$$I=Io \cdot exp[-\beta (Vsd-Vch)],$$

where, Io is a constant including information such as the shape of the MOSFET being actually manufactured, Vsd is the potential at the storage diode 32, Vch is the potential at the channel region 36. The formula indicates the fact that, as the β variations are suppressed, the current I flowing in channel region 36 is uniform accordingly. This can suppress or eliminate the occurrence of variations in the bias charge amount among cells (picture elements).

Moreover, with the embodiment 10a, the voltage of the channel region 36 is firmly fixed at the substrate potential (0V) during the signal-charge read operation to provide what is called the "bipolar charge read" action; therefore, there will no longer take place deviations in the β value of the transistor characteristic of the transfer channel region 36. This can make it possible to successfully suppress the occurrence of a fixed-pattern noise due to deviations in the β value.

A CCD imager 10b shown in FIG. 5 is similar in structure to that of FIG. 2 with (1) the read control gate 42 of FIG. 2 being deleted, and (2) a potential control circuitry 56 being additionally connected to the transparent electrode 50 which covers all the cells of the imager 10b. The circuitry 56 may be an external electric circuit that controls the potential of transparent electrode 50 so that it varies specifically among the reset period Trst, the integration period Titg and the read period Tread.

The significance of the CCD imager 10b is that, while the FIG. 2 embodiment additionally employs the read-control gate electrode 42 being capacitively coupled to the storage diode 32 to control the potential of it, the imager 10b can accomplish the same potential-control function by the use of the transparent electrode 50 as originally arranged, without requiring any additional electrodes. Such a reset/read drive technique for attaining the "transfer-channel potential holding/storage-diode potential varying" feature of the invention using the transparent electrode 50 will be extremely attractive and beneficial to the manufacturers of highly-integrated CCD imagers. This can be said because the CCD imager 10b may be principally equivalent in structure to the presently available solid-state image sensing devices, without the device structure being complicated by adding extra components so that no further risk increases in the manufacture of it.

The reset/read drive operations of the third embodiment 10b will now be described with reference to the "potential well" diagram of FIGS. 6A to 6E and the pulsing sequence diagram of FIGS. 7A to 7G. Note that in FIGS. 6A–6E, the potential well is illustrated like a bucket, and the charge is assumed to behave as if it were liquid in the bucket as it is common practice in the art of CCD devices. Note also that the potential profile, that is the interface potential distribution is plotted so that the positive value increases downwardly.

With this embodiment, an extra charge packet is injected into the storage diode 32 from the injection diode 38 as shown in FIG. 6A, by (1) causing the voltage Vtrs (FIG. 7B) of transfer electrode 16 and the voltage Vig (FIG. 7E) of injection gate 40 to go high at +8V at time t1 of FIG. 7, and (2) causing the voltage Vid (FIG. 7F) of injection diode 38 to drop down at +1V simultaneously. During the injection period Tinj, the voltage Vte (FIG. 7D) of transparent electrode 50 is set at −3V. The injection of charge renders the storage diode 32 equivalent in potential to the injection diode 38.

At time t2 of FIGS. 7A to 7G, while the injection gate voltage Vig is held at +8V, the injection diode voltage Vid goes high to +10V in order to potentially reset the storage diode 32. The transfer electrode voltage Vtrs is at +2V in the same manner as in the previous embodiment 10. Under such a condition, the potential control circuit 56 of FIG. 5 forces the voltage Vte of transparent electrode 50 to drop from −3V down to −9V. When the transparent electrode potential Vte gets lower, the voltage Vsd of storage diode 32 being capacitively coupled to transparent electrode 50 decreases accordingly. A charge corresponding in amount to the potential difference between the channel region 36 and the storage diode 32 is allowed to drain away from the storage diode 32.

At time t3 of FIG. 7D, the transparent electrode voltage Vte potentially rises at −3V again (see FIG. 6C, also). In responding to this potential change, the voltage Vsd of storage diode 32 goes high. The integration of signal charge packet 56 is performed as shown in FIG. 6D. At time t4 (that is, the end of the storage period Titg), the voltage Vte of transparent electrode 50 drops down at −9.1V, whereby the signal charge 56 is moved and read out of the storage diode 32 into the vertical CCD register 34. At this time, the transparent electrode voltage Vtrs is at +2V, thus rendering the transfer channel region 36 conductive (turn on). The transparent electrode voltage Vte during the read period Tread is specifically arranged to be lower than that during the reset period Trst by a certain potential value; for example, while the transparent electrode voltage Vte is at −9V during the reset period Trst, the voltage Vte is set at −9.1V during the read period Tread with a potential difference of 0.1V (=100 mV) therebetween. With such potential difference, a corresponding amount of bias charge is read out in addition to the signal charge 56 as shown in FIG. 6E.

According to the CCD imager 10b, the voltage Vtrs of the transfer electrode 16 is fixed at a certain potential (+2V, in this case) during the reset period Trst for resetting the storage diode 32 at the beginning of each field period Tfld, and during the read period Tread. With such CCD drive technique, the amount of bias charge is controlled by causing the voltage Vte of transparent electrode 50 to potentially change as described above during the reset operation for the storage diode 32 and during the signal-charge read operation as shown in FIG. 8, thereby to force the storage diode 32 to vary in potential similarly. In other words, the read of signal charge 56 (and bias charge 58) is specifically carried out by modulating the potential at the storage diode 32 by the transparent electrode 50 being capacitively coupled to the storage diode 32, rather than by modulating the potential at the transfer channel region 36, as in the previous embodiments 10, 10a. With such an arrangement also, it becomes possible to suppress or eliminate the occurrence of an undesirable fix-pattern noise due to inherent potential variations at the transfer channel region 36 in the prior art.

The present invention is not limited to the above-described specific embodiments and may be practiced or embodied in still other ways without departing from the spirit or essential character thereof.

For example, with the first embodiment 10 as previously described, when the signal charge packet is read out from the storage diode 32 during the period Tread, the potential drop of the read control-gate voltage Vrc and the potential rise of the transfer-electrode voltage Vtrs are arranged to take place substantially simultaneously (at the time t4 as shown in FIGS. 3B and 3E). It may be also permissible, in the reduction of the invention to practice, that the potential changes of such voltages are slightly shifted in timing sequence.

In addition, while the CCD imager 10b is explained to operate in accordance with the "MOS charge-read" scheme, the imager 10b may be modified to alternatively employ the "bipolar charge-read" technique as has been explained in connection with the CCD imager 10a, by adding thereto the channel-potential control electrode 54 of FIG. 4, if required.

What is claimed is:

1. A method for driving a solid-state image sensing device comprising a substrate, an array of charge-packet storage cells on said substrate, each of said cells having a storage layer for storing therein a charge packet indicative of an incident light, a charge transfer section coupled to said array of cells, said transfer section including a spaced-apart charge-coupled device (CCD) register layer for defining a channel region between itself and said storage layer in said substrate, and an insulated transfer electrode overlying said register layer and said channel region, a transparent electrode over said substrate for covering said array of cells, and reset means for potentially resetting said storage layer by causing an extra charge to be injected into and then removed from said storage layer, said method comprising the step of:

reading a charge out of said storage layer toward said CCD register layer through said channel region, by causing said storage layer to vary in potential while having said channel region set at a certain fixed potential, wherein said step of reading a charge includes the steps of:

causing said channel region to be fixed at the certain potential that is substantially equivalent to its potential being set during a reset operation for said storage layer; and, substantially simultaneously, forcing said storage layer to decrease in potential thereby allowing the charge to flow from said storage layer toward said register layer.

2. The method according to claim 1, wherein said step for forcing said storage layer to decrease in potential is accomplished by controlling a potential of an electrode that is capacitively coupled to said storage layer.

3. The method according to claim 1, wherein said step for forcing said storage layer to decrease in potential is accomplished by controlling a potential of said transparent electrode.

4. The method according to claim 1, wherein said step for forcing said storage layer to decrease in potential is accomplished by controlling a potential of an additional electrode, located above said insulated transfer electrode, and that is capacitively coupled to said storage layer.

5. The method according to claim 1, wherein said certain potential is substantially the same as a potential of said substrate.

6. The method according to claim 5, wherein said potential of said substrate is a ground potential.

7. The method according to claim 1, wherein said certain potential is a preselected potential that is greater enough to cause said channel region to become conductive.

8. The method according to claim 6, wherein said step of reading a charge further includes the step of:

forcing said channel region to be fixed at said preselected potential independently of said storage layer and said CCD register layer at least during a charge read operation.

9. The method according to claim 8, wherein said channel region is set at said preselected potential during the reset operation and the charge read operation.

10. The method according to claim 9, wherein said preselected potential is positive in polarity.

11. The method according to claim 1, wherein said solid-state image sensing device further comprises a photoconductive layer arranged over said array of charge-packet storage cells.

* * * * *